United States Patent
Brady

(10) Patent No.: US 8,017,426 B2
(45) Date of Patent: Sep. 13, 2011

(54) COLOR FILTER ARRAY ALIGNMENT MARK FORMATION IN BACKSIDE ILLUMINATED IMAGE SENSORS

(75) Inventor: Frederick T. Brady, Rochester, NY (US)

(73) Assignee: Omnivision Technologies, Inc., Santa Clara, CA (US)

( * ) Notice: Subject to any disclaimer, the term of this patent is extended or adjusted under 35 U.S.C. 154(b) by 368 days.

(21) Appl. No.: 12/169,709

(22) Filed: Jul. 9, 2008

(65) Prior Publication Data

US 2010/0006909 A1    Jan. 14, 2010

(51) Int. Cl.
*H01L 21/00* (2006.01)

(52) U.S. Cl. ............ 438/70; 438/72; 438/401; 438/417; 438/489; 257/E31.127

(58) Field of Classification Search .................... 438/70, 438/72, 401, 417, 489; 257/E31.127
See application file for complete search history.

(56) References Cited

U.S. PATENT DOCUMENTS

| | | |
|---|---|---|
| 5,227,313 A | 7/1993 | Gluck et al. |
| 5,244,817 A | 9/1993 | Hawkins et al. |
| 5,969,368 A | 10/1999 | Thompson et al. |
| 6,168,965 B1 | 1/2001 | Malinovich et al. |
| 6,429,036 B1 | 8/2002 | Nixon et al. |
| 7,315,014 B2 | 1/2008 | Lee et al. |
| 2005/0104148 A1 | 5/2005 | Yamamoto et al. |
| 2006/0068586 A1 | 3/2006 | Pain |
| 2007/0194397 A1 | 8/2007 | Adkisson et al. |
| 2008/0038864 A1 | 2/2008 | Yoo et al. |
| 2011/0042770 A1* | 2/2011 | Brady ........................ 257/432 |
| 2011/0059572 A1* | 3/2011 | Brady .......................... 438/72 |

FOREIGN PATENT DOCUMENTS

WO    2007/030226    3/2007

OTHER PUBLICATIONS

T. Joy et al., "Development of a Production-Ready, Back-Illuminated CMOS Image Sensor with Small Pixels," IEEE IEDM, Dec. 2007, pp. 1007-1010.

* cited by examiner

*Primary Examiner* — Jack Chen
(74) *Attorney, Agent, or Firm* — Blakely Sokoloff Taylor & Zafman LLP

(57) ABSTRACT

A backside illuminated image sensor includes a sensor layer comprising photosensitive elements of the pixel array, an epitaxial layer formed on a frontside surface of the sensor layer, and a color filter array formed on a backside surface of the sensor layer. The epitaxial layer comprises polysilicon color filter array alignment marks formed in locations corresponding to respective color filter array alignment mark openings in the frontside surface of the sensor layer. The color filter array is aligned to the color filter array alignment marks of the epitaxial layer. The image sensor may be implemented in a digital camera or other type of digital imaging device.

10 Claims, 4 Drawing Sheets

COLOR FILTER ARRAY ALIGNMENT MARK FORMATION IN BACKSIDE ILLUMINATED IMAGE SENSORS

CROSS REFERENCE TO RELATED APPLICATIONS

The present invention is related to the inventions described in commonly-assigned U.S. patent applications Ser. No. 12/169,791, entitled "Wafer Level Processing for Backside Illuminated Image Sensors," Ser. No. 12/169,810, entitled "Backside Illuminated Image Sensor with Shallow Backside Trench for Photodiode Isolation," and Ser. No. 12/169,723, entitled "Backside Illuminated Image Sensor with Reduced Dark Current," which are concurrently filed herewith. The disclosures of these related applications are incorporated by reference herein in their entirety.

FIELD OF THE INVENTION

The present invention relates generally to electronic image sensors for use in digital cameras and other types of imaging devices, and more particularly to processing techniques for use in forming backside illuminated image sensors.

BACKGROUND OF THE INVENTION

A typical electronic image sensor comprises a number of light sensitive picture elements ("pixels") arranged in a two-dimensional array. Such an image sensor may be configured to produce a color image by forming an appropriate color filter array (CFA) over the pixels. Examples of image sensors of this type are disclosed in U.S. Patent Application Publication No. 2007/0024931, entitled "Image Sensor with Improved Light Sensitivity," which is incorporated by reference herein.

As is well known, an image sensor may be implemented using complementary metal-oxide-semiconductor (CMOS) circuitry. In such an arrangement, each pixel typically comprises a photodiode and other circuitry elements that are formed in a silicon sensor layer on a silicon substrate. One or more dielectric layers are usually formed above the silicon sensor layer and may incorporate additional circuitry elements as well as multiple levels of metallization used to form interconnects. The side of the image sensor on which the dielectric layers and associated levels of metallization are formed is commonly referred to as the frontside, while the side having the silicon substrate is referred to as the backside.

In a frontside illuminated image sensor, light from a subject scene is incident on the frontside of the image sensor, and the silicon substrate is relatively thick. However, the presence of metallization level interconnects and various other features associated with the dielectric layers on the frontside of the image sensor can adversely impact the fill factor and quantum efficiency of the image sensor.

A backside illuminated image sensor addresses the fill factor and quantum efficiency issues associated with the frontside dielectric layers by thinning or removing the thick silicon substrate and arranging the image sensor such that light from a subject scene is incident on the backside of the image sensor. Thus, the incident light is no longer impacted by metallization level interconnects and other features of the dielectric layers, and fill factor and quantum efficiency are improved.

A problem that can arise in backside illuminated image sensors relates to ensuring proper alignment between image sensor features that are formed using frontside processing operations with those formed using backside processing operations. For example, photodiodes may be formed in the sensor layer using frontside processing operations while corresponding color filter elements of the above-noted CFA are formed using backside processing operations. Features formed using frontside processing operations are referred to as frontside features, while features formed using backside processing operations are referred to as backside features.

Typical conventional approaches utilize frontside alignment marks to align different lithography masks that are applied in various frontside processing operations used to form the frontside features. However, such techniques fail to adequately address the alignment of backside features with the frontside features. Thus, it remains difficult under conventional practice to align backside features such as the color filter elements of the CFA with frontside features such as the photodiodes of the sensor layer. Any alignment mismatch between the CFA elements and the photodiodes can significantly degrade the performance of the image sensor.

Accordingly, a need exists for improved processing techniques for forming backside illuminated image sensors.

SUMMARY OF THE INVENTION

Illustrative embodiments of the invention provide backside illuminated image sensors having improved performance through the use of polysilicon alignment marks that reduce alignment mismatch between CFA elements and their respective photodiodes.

In accordance with one aspect of the invention, a process of forming CFA alignment marks in a backside illuminated image sensor is provided. The alignment mark formation process may be part of a wafer level process for forming a plurality of image sensors each having a pixel array configured for backside illumination, with the image sensors being formed utilizing an image sensor wafer. The image sensor wafer comprises at least a substrate and a sensor layer formed over the substrate. The alignment mark formation process comprises the steps of forming CFA alignment mark openings in the sensor layer, and forming an epitaxial layer on a frontside surface of the sensor layer. The epitaxial layer comprises polysilicon CFA alignment marks formed in locations corresponding to respective ones of the CFA alignment mark openings in the sensor layer.

In one of the above-noted illustrative embodiments, the image sensor wafer comprises a silicon-on-insulator (SOI) wafer having a buried oxide layer arranged between the substrate and the sensor layer. In such an embodiment, the image sensor wafer may be further processed by exposing a backside surface of the oxide layer, and forming CFAs on the backside surface of the oxide layer in alignment with the CFA alignment marks. This approach advantageously provides direct alignment between a frontside feature of the image sensor, namely the CFA alignment marks, and a backside feature of the image sensor, namely the CFAs formed on the backside surface of the oxide layer. As other frontside features, such as photosensitive elements formed in the sensor layer, can also be aligned to the CFA alignment marks, accurate alignment between the color filter elements of the CFAs and their associated photosensitive elements is thereby ensured.

In accordance with another aspect of the invention, a backside illuminated image sensor includes a sensor layer comprising photosensitive elements of the pixel array, an epitaxial layer formed on a frontside surface of the sensor layer, and a CFA formed on a backside surface of the sensor layer. The epitaxial layer comprises polysilicon CFA alignment marks formed in locations corresponding to respective CFA alignment mark openings in the frontside surface of the sensor layer. The CFA is aligned to the CFA alignment marks of the epitaxial layer.

A backside illuminated image sensor in accordance with the invention may be advantageously implemented in a digital camera or other type of imaging device. Improved performance is provided in such a device through better alignment of CFAs with their associated photosensitive elements, without significantly increasing image sensor die size or cost.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

The present invention will be illustrated herein in conjunction with particular embodiments of digital cameras, backside illuminated image sensors, and processing techniques for forming such image sensors. It should be understood, however, that these illustrative arrangements are presented by way of example only, and should not be viewed as limiting the scope of the invention in any way. Those skilled in the art will recognize that the disclosed arrangements can be adapted in a straightforward manner for use with a wide variety of other types of imaging devices and image sensors.

Figure 1:
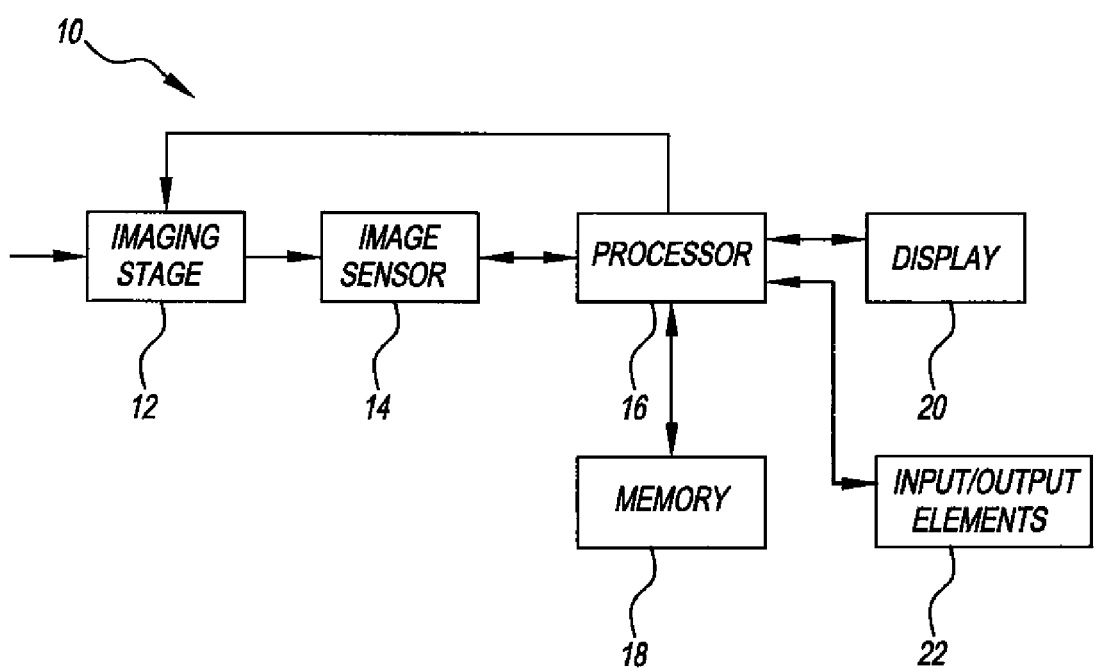
FIG. 1 is a block diagram of a digital camera having a backside illuminated image sensor configured in accordance with an illustrative embodiment of the invention.

FIG. 1 shows a digital camera 10 in an illustrative embodiment of the invention. In the digital camera, light from a subject scene is input to an imaging stage 12. The imaging stage may comprise conventional elements such as a lens, a neutral density filter, an iris and a shutter. The light is focused by the imaging stage 12 to form an image on an image sensor 14, which converts the incident light to electrical signals. The digital camera 10 further includes a processor 16, a memory 18, a display 20, and one or more additional input/output (I/O) elements 22.

Although shown as separate elements in the embodiment of FIG. 1, the imaging stage 12 may be integrated with the image sensor 14, and possibly one or more additional elements of the digital camera 10, to form a compact camera module.

The image sensor 14 is assumed in the present embodiment to be a CMOS image sensor, although other types of image sensors may be used in implementing the invention. More particularly, the image sensor 14 comprises a backside illuminated image sensor that is formed in a manner to be described below in conjunction with FIGS. 2 through 5. The image sensor generally comprises a pixel array having a plurality of pixels arranged in rows and columns and may include additional circuitry associated with sampling and readout of the pixel array, such as signal generation circuitry, signal processing circuitry, row and column selection circuitry, etc. This sampling and readout circuitry may comprise, for example, an analog signal processor for processing analog signals read out from the pixel array and an analog-to-digital converter for converting such signals to a digital form. These and other types of circuitry suitable for use in the digital camera 10 are well known to those skilled in the art and will therefore not be described in detail herein. Portions of the sampling and readout circuitry may be arranged external to the image sensor, or formed integrally with the pixel array, for example, on a common integrated circuit with photodiodes and other elements of the pixel array.

The image sensor 14 will typically be implemented as a color image sensor having an associated CFA pattern. Examples of CFA patterns that may be used with the image sensor 14 include those described in the above-cited U.S. Patent Application Publication No. 2007/0024931, although other CFA patterns may be used in other embodiments of the invention. As another example, a conventional Bayer pattern may be used, as disclosed in U.S. Pat. No. 3,971,065, entitled "Color Imaging Array," which is incorporated by reference herein.

The processor 16 may comprise, for example, a microprocessor, a central processing unit (CPU), an application-specific integrated circuit (ASIC), a digital signal processor (DSP), or other processing device, or combinations of multiple such devices. Various elements of the imaging stage 12 and the image sensor 14 may be controlled by timing signals or other signals supplied from the processor 16.

The memory 18 may comprise any type of memory, such as, for example, random access memory (RAM), read-only memory (ROM), Flash memory, disk-based memory, removable memory, or other types of storage elements, in any combination.

Functionality associated with sampling and readout of the pixel array and the processing of corresponding image data may be implemented at least in part in the form of software that is stored in memory 18 and executed by processor 16.

A given image captured by the image sensor 14 may be stored by the processor 16 in memory 18 and presented on display 20. The display 20 is typically an active matrix color liquid crystal display (LCD), although other types of displays may be used. The additional I/O elements 22 may comprise, for example, various on-screen controls, buttons or other user interfaces, network interfaces, memory card interfaces, etc.

Additional details regarding the operation of a digital camera of the type shown in FIG. 1 can be found, for example, in the above-cited U.S. Patent Application Publication No. 2007/0024931.

It is to be appreciated that the digital camera as shown in FIG. 1 may comprise additional or alternative elements of a type known to those skilled in the art. Elements not specifically shown or described herein may be selected from those known in the art. As noted previously, the present invention may be implemented in a wide variety of other types of digital cameras or imaging devices. Also, as mentioned above, certain aspects of the embodiments described herein may be implemented at least in part in the form of software executed by one or more processing elements of an imaging device. Such software can be implemented in a straightforward manner given the teachings provided herein, as will be appreciated by those skilled in the art.

The image sensor 14 may be fabricated on a silicon substrate or other type of substrate. In a typical CMOS image sensor, each pixel of the pixel array includes a photodiode and associated circuitry for measuring the light level at that pixel.

Such circuitry may comprise, for example, transfer gates, reset transistors, select transistors, output transistors, and other elements, configured in a well-known conventional manner.

As indicated above, FIGS. 2 through 5 illustrate the process of forming the backside illuminated image sensor 14 in one embodiment of the present invention. It should be noted that these figures are simplified in order to clearly illustrate various aspects of the present invention, and are not necessarily drawn to scale. A given embodiment may include a variety of other features or elements that are not explicitly illustrated but would be familiar to one skilled in the art as being commonly associated with image sensors of the general type described.

Figure 2:
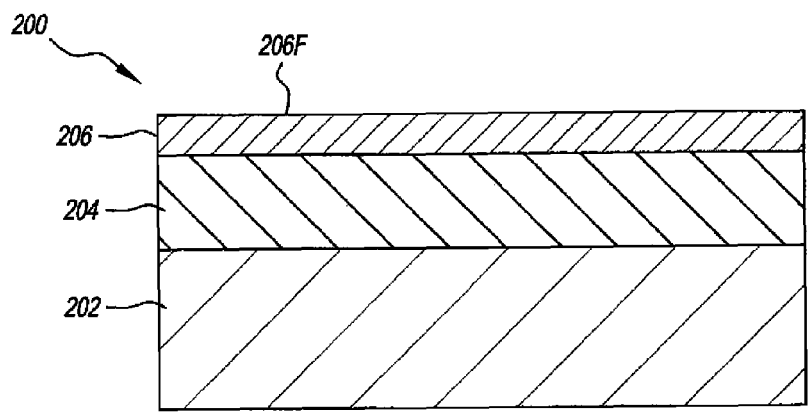
FIGS. 2 through 5 are cross-sectional views showing portions of a backside illuminated image sensor at various steps in an exemplary process for forming such an image sensor, in accordance with an illustrative embodiment of the invention.

FIG. 2 shows a portion of an image sensor wafer 200 at the completion of a number of initial steps of a conventional CMOS process flow. As these steps are well known in the art, they will not be described in detail herein. The image sensor wafer 200 at this stage comprises a silicon substrate 202, a buried oxide (BOX) layer 204 formed over the substrate, and a silicon sensor layer 206 formed over the oxide layer.

As will be described, the image sensor wafer 200 is further processed to form a plurality of image sensors each having a pixel array configured for backside illumination. It should be noted that the image sensor formation process to be described will focus on the formation of CFA alignment marks. Other aspects of image sensor formation, such as the formation of photodiodes and associated circuitry of the pixel array in sensor layer 206, and the formation of additional features, such as circuitry, conductors, bond pads and so on, may be implemented using conventional techniques that are familiar to one skilled in the art.

The image sensor wafer 200 has a frontside and a backside as indicated in FIG. 2. As described previously herein, the frontside refers generally to the side of an image sensor on which dielectric layers and associated levels of metallization are formed, while the side having the silicon substrate is referred to as the backside. The terms "frontside" and "backside" will be used herein to denote particular sides of an image sensor wafer or an image sensor formed from such a wafer, as well as sides of particular layers of the image sensor wafer or corresponding image sensor. For example, the sensor layer 206 has a frontside surface 206F and a backside surface 206B.

As mentioned above, the illustrative embodiments relate to backside illuminated image sensors, that is, image sensors in which light from a subject scene is incident on the photodiodes or other photosensitive elements of the pixel array from a backside of the sensor.

It should be noted that terms such as "on" or "over" when used in conjunction with layers of an image sensor wafer or corresponding image sensor are intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

The image sensor wafer 200 illustrated in FIG. 2 is an example of a silicon-on-insulator (SOI) wafer. In such a wafer, the thickness of the silicon sensor layer 206 may be approximately 1 to 6 micrometers (μm), and the thickness of the buried oxide layer 204 may be approximately 0.1 to 0.5 μm, although other thicknesses may be used. The silicon substrate 202 is typically substantially thicker than the sensor layer or buried oxide layer. Alternative embodiments of the invention may utilize other types of wafers to form backside illuminated image sensors, such as, for example, epitaxial wafers or bulk semiconductor wafers that do not include a buried oxide layer, although an SOI wafer generally provides a smoother surface for backside processing.

Figure 3:
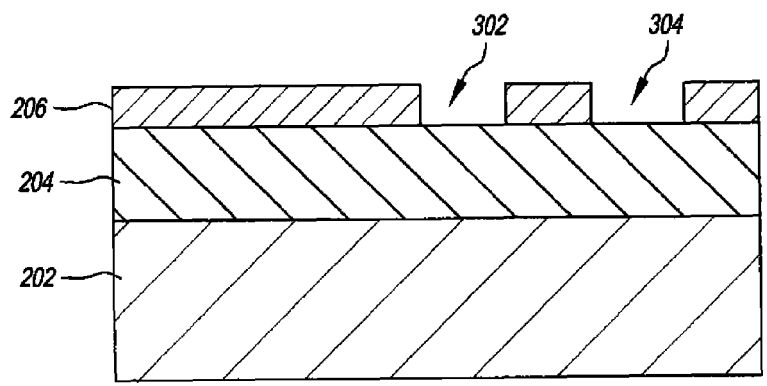
Figure 4:
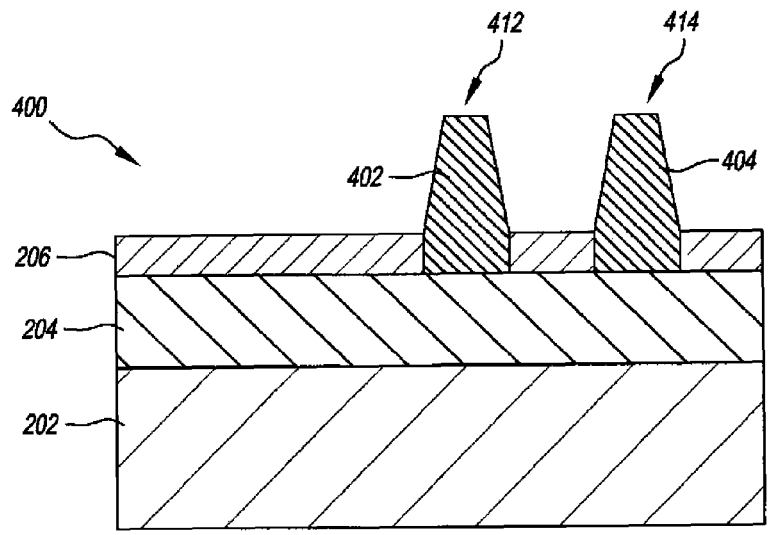
Figure 5:
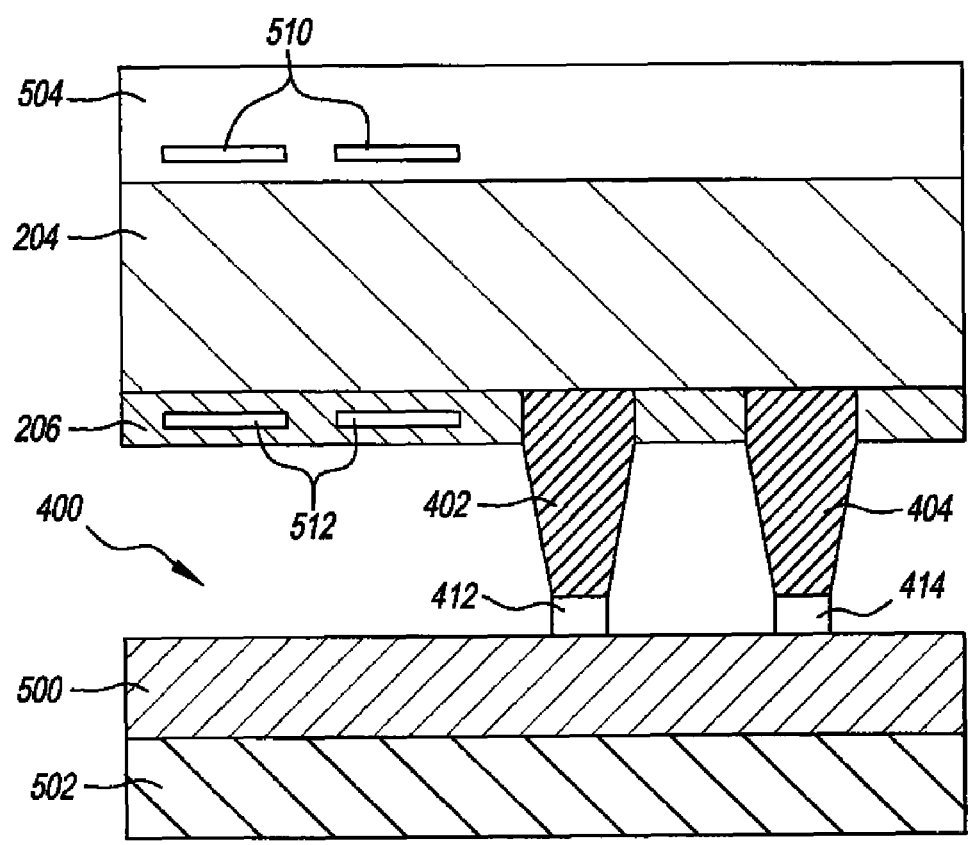

The image sensor wafer 200 is further processed in the manner shown in FIGS. 3 through 5 in forming the backside illuminated image sensor 14 of FIG. 1.

With reference to FIG. 3, CFA alignment mark openings 302 and 304 are formed in the sensor layer 206 as shown. These openings may be formed, for example, using conventional lithography operations such as photoresist deposition followed by exposing, developing, etching and stripping. The openings are patterned in accordance with a desired alignment mark pattern, which will generally depend upon the particular type of lithography equipment being used to process the image sensor wafer.

The CFA alignment mark openings 302 and 304 are illustratively shown in FIG. 3 as being etched through the sensor layer 206 to expose an underlying frontside surface of the buried oxide layer 204. This is an example of an arrangement in which the openings are etched down to the oxide layer. In other embodiments, the depth of the etching operation may be adjusted such that the openings terminate within the sensor layer, or extend through the sensor layer and terminate in the oxide layer.

An epitaxial layer 400 is then formed on a frontside surface of the sensor layer 206, as illustrated in FIG. 4. This layer may be formed, for example, by epitaxial growth of silicon through deposition over the frontside surface of the sensor layer 206. The unetched portions of the frontside surface of the sensor layer generally comprise single crystalline silicon, while the etched openings 302, 304 expose the frontside surface of the underlying buried oxide layer 204. Epitaxial growth over single crystalline silicon will result in single crystalline silicon having the same orientation as the underlying single crystalline silicon, while epitaxial growth over an oxide will exhibit no particular orientation, but will instead be in the form of polycrystalline silicon ("polysilicon"). Thus, the formation of the epitaxial layer 400 results in the formation of polysilicon CFA alignment marks 402, 404 in locations corresponding to respective ones of the CFA alignment mark openings 302, 304 in the sensor layer. It can also be seen that the epitaxial growth produces gaps in respective areas denoted 412, 414 over the polysilicon alignment marks 402 and 404 as shown.

The polysilicon CFA alignment marks 402, 404 in this example are shown as having a cross-sectional shape that is substantially trapezoidal. Other mark shapes may be used, again depending upon the particular characteristics and requirements of the lithography equipment used to process the image sensor wafer.

FIG. 5 illustrates the image sensor wafer 200 after further processing operations. A dielectric layer 500 is formed on a frontside surface of the epitaxial layer 400. The dielectric layer in this embodiment comprises multiple layers of dielectric material and may include, for example, an interlayer dielectric (ILD) and an intermetal dielectric (IMD) that separates multiple levels of metallization. Various image sensor features such as interconnects, gates or other circuitry elements may be formed within the dielectric layer 500 using conventional techniques. It can be seen that at least a portion of the dielectric layer 500 fills the gaps in areas 412, 414. Although only a single dielectric layer 500 is shown in the diagram of FIG. 5, other embodiments may comprise multiple dielectric layers, possibly separated from one another by one or more intervening layers.

After formation of the dielectric layer 500, a handle wafer 502 is attached to a frontside surface of layer 500. The handle wafer 502 may be attached using, for example, low temperature oxide-to-oxide bonding.

The substrate 202 is then removed to expose a backside surface of the buried oxide layer 204. The substrate may be removed using, for example, grinding, polishing or etching techniques, in any combination. Typically, the substrate is removed in its entirety, exposing the buried oxide layer 204 at the backside of the wafer. In an alternative embodiment, such as one involving an epitaxial or bulk semiconductor wafer, the substrate may be thinned rather than completely removed.

Following removal of the substrate, the structure is flipped over and CFAs and associated microlenses are formed in a CFA layer 504 on the backside surface of the buried oxide layer 204, as shown in FIG. 5. The handle wafer 502 serves as a substrate, providing support for the structure after the removal of the original substrate 202. Generally, each of the pixel arrays of the image sensor wafer has a corresponding CFA which includes color filter elements 510 that are arranged over respective photosensitive elements 512 of the sensor layer 206. As indicated elsewhere herein, the photosensitive elements may comprise photodiodes. Although not explicitly shown in the figure, a microlens may be associated with each of the color filter elements 510 of CFA layer 504.

The color filter elements 510 and their associated microlenses are formed in alignment with the polysilicon alignment marks 402, 404. The photosensitive elements 512 are also formed in alignment with the polysilicon alignment marks 402, 404. This arrangement ensures accurate alignment between the photosensitive elements 512 of the sensor layer 206 and the corresponding color filter elements 510 of the CFA layer 504. The particular lithographic techniques that may be used to align the CFAs, microlenses and photosensitive elements to alignment marks such as the polysilicon alignment marks 402, 404 are well known in the art and therefore not described in detail herein.

The image sensor wafer as shown in FIG. 5 is then subject to further processing operations in order to form the image sensor 14 utilized in digital camera 10 of FIG. 1. Generally, the resulting processed image sensor wafer is diced into a plurality of image sensors configured for backside illumination, one of which is the image sensor 14 in digital camera 10. The wafer dicing operation will be described in greater detail below in conjunction with FIG. 6. The handle wafer 502 in this embodiment is not removed prior to dicing, but instead serves as a permanent handle wafer, portions of which remain part of respective ones of the image sensors that are separated from one another in the dicing operation.

In an alternative embodiment, a temporary carrier wafer may be used in place of the handle wafer 502. The temporary carrier wafer may be attached using epoxy or another suitable adhesive. After attachment of the temporary carrier wafer, the substrate 202 is removed as described above. A transparent cover sheet comprising transparent covers overlying respective ones of the CFAs may then be attached to the backside surface of the image sensor wafer prior to removing the temporary carrier wafer. Each such glass cover may comprise a central cavity arranged over its corresponding CFA and further comprise peripheral supports secured to the backside surface of the oxide layer 204 via epoxy. The transparent cover sheet may be formed of glass or another transparent material. Such a cover sheet may be attached to the wafer as a single sheet which is divided into separate covers when the image sensors are diced from the wafer. Further details regarding the use of a temporary carrier wafer and transparent cover sheet may be found in the above-cited U.S. patent application Ser. No. 12/169,791. However, it is to be appreciated that use of such elements and associated processing operations is not a requirement of the present invention.

Figure 6:
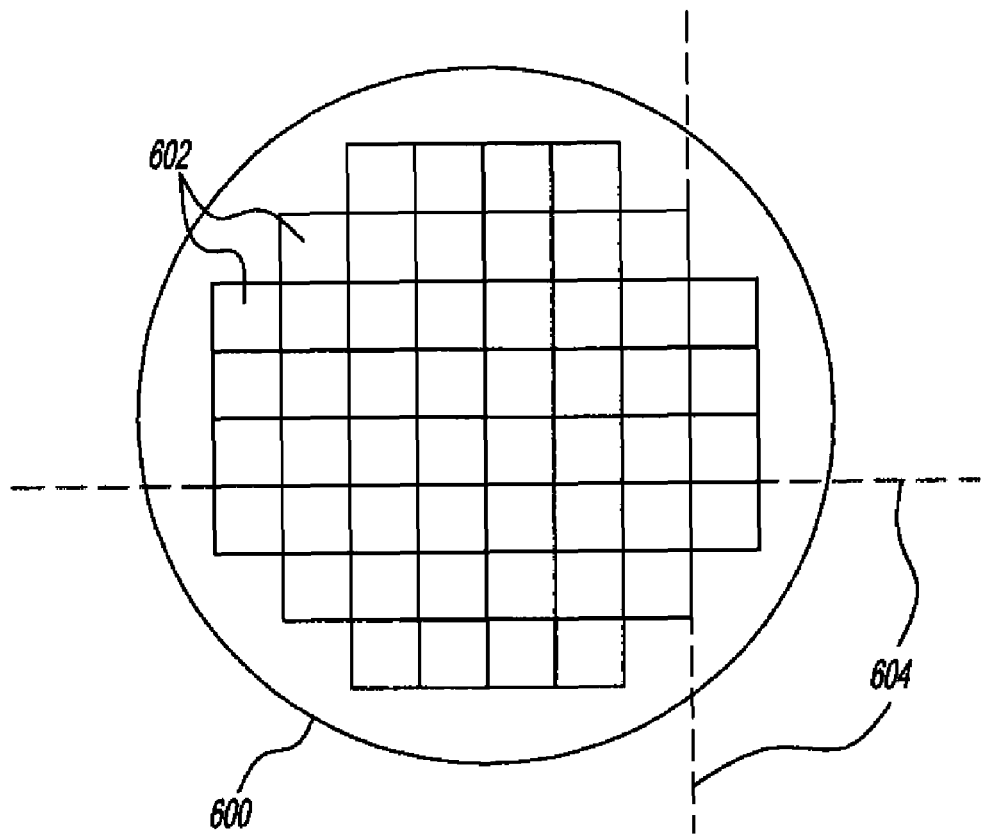
FIG. 6 is a plan view of an image sensor wafer comprising multiple image sensors formed using the exemplary process of FIGS. 2 through 5.

As indicated above, the processing operations illustrated in FIGS. 2 through 5 are wafer level processing operations applied to an image sensor wafer. FIG. 6 shows a plan view of an image sensor wafer 600 comprising a plurality of image sensors 602. The image sensors 602 are formed through wafer level processing of the image sensor wafer 600 as described in conjunction with FIGS. 2 through 5. The image sensors are then separated from one another by dicing the wafer along dicing lines 604. A given one of the image sensors 602 corresponds to image sensor 14 in digital camera 10 of FIG. 1.

The above-described illustrative embodiments advantageously provide an improved processing arrangement for forming a backside illuminated image sensor. For example, the CFA alignment marks 402 and 404 are frontside alignment marks that can be used to directly align a backside feature, illustratively the color filter elements 510 of the CFA layer 504. This allows for better alignment of the color filter elements with their associated photosensitive elements, thereby improving image sensor performance.

The invention has been described in detail with particular reference to certain illustrative embodiments thereof, but it will be understood that variations and modifications can be effected within the scope of the invention as set forth in the appended claims. For example, the invention can be implemented in other types of image sensors and digital imaging devices, using alternative materials, wafers, layers, process steps, etc. These and other alternative embodiments will be readily apparent to those skilled in the art.

PARTS LIST 10 digital camera
12 imaging stage
14 backside illuminated image sensor
16 processor
18 memory
20 display
22 input/output (I/O) elements
200 image sensor wafer
202 substrate
204 buried oxide (BOX) layer
206 sensor layer
206B sensor layer backside surface
206F sensor layer frontside surface
302, 304 openings
400 epitaxial layer
402, 404 color filter array (CFA) alignment marks
412, 414 gap areas
500 dielectric layer
502 handle wafer
504 CFA layer
510 color filter elements
512 photosensitive elements
600 image sensor wafer
602 image sensors
604 dicing lines

The invention claimed is:

1. A method of forming color filter array alignment marks in an image sensor wafer, the image sensor wafer being utilized to form a plurality of image sensors each having a pixel array configured for backside illumination, the image sensor wafer comprising at least a substrate and a sensor layer, the method comprising:

forming color filter array alignment mark openings in the sensor layer; and forming a single crystalline silicon epitaxial layer on unetched portions of a frontside surface of the sensor layer while simultaneously forming polysilicon color filter array alignment marks in respective ones of the etched color filter array alignment mark openings in the sensor layer.

2. The method of claim 1 wherein the image sensor wafer comprises an oxide layer arranged between the substrate and the sensor layer, the method further comprising:

exposing a backside surface of the oxide layer; and forming color filter arrays on the backside surface of the oxide layer in alignment with the color filter array alignment marks.

3. The method of claim 2 wherein exposing a backside surface of the oxide layer further comprises:

forming a dielectric layer on a frontside surface of the epitaxial layer;

attaching a handle wafer to a frontside surface of the dielectric layer; and removing the substrate to expose the backside surface of the oxide layer.

4. The method of claim 3 further comprising separating a resulting processed wafer into the plurality of image sensors.

5. The method of claim 1 wherein forming color filter array alignment mark openings in the sensor layer further comprises etching the openings such that the openings terminate in the sensor layer.

6. The method of claim 2 wherein forming color filter array alignment mark openings in the sensor layer further comprises etching the openings such that the openings extend through the sensor layer and terminate in the oxide layer.

7. The method of claim 2 wherein forming color filter array alignment mark openings in the sensor layer further comprises etching the openings such that the openings extend through the sensor layer and terminate at a frontside surface of the oxide layer.

8. The method of claim 2 further comprising forming microlenses over respective color filter elements of the color filter arrays in alignment with the color filter array alignment marks.

9. The method of claim 3 wherein said dielectric layer comprises an interlayer dielectric and further comprises an intermetal dielectric separating multiple levels of metallization.

10. The method of claim 1 wherein the image sensor wafer comprises a silicon-on-insulator (SOI) wafer.

* * * * *